US012178291B2

(12) United States Patent
Donohoe et al.

(10) Patent No.: US 12,178,291 B2
(45) Date of Patent: *Dec. 31, 2024

(54) AUTOLACING FOOTWEAR MOTOR HAVING ROTARY DRUM ENCODER

(71) Applicant: NIKE, Inc., Beaverton, OR (US)

(72) Inventors: Brendan Donohoe, Beaverton, OR (US); Holli Pheil, Portland, OR (US); Summer L. Schneider, Beaverton, OR (US)

(73) Assignee: NIKE, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/967,064

(22) Filed: Oct. 17, 2022

(65) Prior Publication Data

US 2023/0030904 A1 Feb. 2, 2023

Related U.S. Application Data

(63) Continuation of application No. 16/694,327, filed on Nov. 25, 2019, now Pat. No. 11,470,910.
(Continued)

(51) Int. Cl.
*A43B 3/34* (2022.01)
*A43C 1/04* (2006.01)
(Continued)

(52) U.S. Cl.
CPC .............. *A43C 11/165* (2013.01); *A43B 3/34* (2022.01); *A43C 1/04* (2013.01); *A43C 1/06* (2013.01);
(Continued)

(58) Field of Classification Search
CPC ........ A43B 3/34; A43C 11/14; B65H 75/4486
(Continued)

(56) References Cited

U.S. PATENT DOCUMENTS 5,303,485 A * 4/1994 Goldston ............. A43B 1/0072
36/137
5,323,650 A 6/1994 Fullen et al.
(Continued)

FOREIGN PATENT DOCUMENTS

CN 101154429 4/2008
CN 101562957 10/2009
(Continued)

OTHER PUBLICATIONS

"Chinese Application Serial No. 201980078402.4, Response filed Nov. 1, 2022 to Office Action mailed Jul. 1, 2022", w English claims, 8 pgs.
(Continued)

*Primary Examiner* — Timothy K Trieu
(74) *Attorney, Agent, or Firm* — Schwegman, Lundberg & Woessner, P.A.

(57) ABSTRACT

An article of footwear, method, and motorized lacing system includes a motor, including a motor shaft, a spool, coupled to the motor shaft, configured to spool and unspool the lace based on the turning of the motor shaft, a processor circuit, and a three-dimensional encoder. The three-dimensional encoder defines a major axis and has a surface having a tabs extending from a drum, an optical sensor, positioned within optical range of the cylindrical encoder, configured to output a signal to the processor circuit indicative of a detected one of the tabs, and a beam break, positioned between the three-dimensional encoder and the optical sensor, forming a pair of slits. The optical sensor is positioned to view the tabs through the pair of slits, wherein the processor circuit is configured to operate the motor based, at least in part, on the signal as received from the optical sensor.

7 Claims, 14 Drawing Sheets

Related U.S. Application Data

(60) Provisional application No. 62/773,867, filed on Nov. 30, 2018, provisional application No. 62/773,842, filed on Nov. 30, 2018.

(51) Int. Cl.
| | |
|---|---|
| A43C 1/06 | (2006.01) |
| A43C 7/08 | (2006.01) |
| A43C 11/16 | (2006.01) |
| B65H 75/44 | (2006.01) |
| H05K 5/02 | (2006.01) |
| A43B 11/00 | (2006.01) |

(52) U.S. Cl.
CPC ........... *A43C 7/08* (2013.01); *B65H 75/4484* (2013.01); *B65H 75/4486* (2013.01); *H05K 5/02* (2013.01); *A43B 11/00* (2013.01); *B65H 2403/40* (2013.01); *H05K 2201/10121* (2013.01)

(58) Field of Classification Search
USPC .............................................................. 36/97
See application file for complete search history.

(56) References Cited

U.S. PATENT DOCUMENTS

| | | | |
|---|---|---|---|
| 5,599,088 | A | 2/1997 | Chien |
| 5,813,148 | A | 9/1998 | Guerra |
| 6,427,361 | B1* | 8/2002 | Chou .................. A43C 11/008 36/138 |
| 6,691,433 | B2 | 2/2004 | Liu |
| 7,426,873 | B1 | 9/2008 | Kholwadwala et al. |
| 7,721,468 | B1 | 5/2010 | Johnson et al. |
| 8,046,937 | B2 | 11/2011 | Beers et al. |
| 8,676,541 | B2 | 3/2014 | Schrock et al. |
| 8,904,672 | B1* | 12/2014 | Johnson ................. A43B 11/00 36/58.6 |
| 9,578,926 | B2 | 2/2017 | Alt et al. |
| 10,034,622 | B1 | 7/2018 | Mahmoud |
| 11,185,130 | B2 | 11/2021 | Bock et al. |
| 11,209,070 | B2 | 12/2021 | Orand |
| 11,470,910 | B2 | 10/2022 | Donohoe et al. |
| 11,819,087 | B2 | 11/2023 | Donohoe |
| 2003/0150135 | A1 | 8/2003 | Liu |
| 2003/0204938 | A1 | 11/2003 | Hammerslag |
| 2005/0030734 | A1 | 2/2005 | Botzer et al. |
| 2006/0191164 | A1 | 8/2006 | Dinndorf et al. |
| 2007/0000154 | A1 | 1/2007 | Dibenedetto et al. |
| 2009/0272007 | A1 | 11/2009 | Beers et al. |
| 2009/0272013 | A1 | 11/2009 | Beers et al. |
| 2012/0217982 | A1 | 8/2012 | Narayanasamy et al. |
| 2013/0213144 | A1 | 8/2013 | Rice et al. |
| 2013/0213147 | A1 | 8/2013 | Rice et al. |
| 2014/0068838 | A1 | 3/2014 | Beers et al. |
| 2014/0082963 | A1 | 3/2014 | Beers |
| 2014/0165378 | A1 | 6/2014 | Mann et al. |
| 2014/0165427 | A1 | 6/2014 | Molyneux et al. |
| 2014/0200834 | A1 | 7/2014 | Ross |
| 2015/0108353 | A1 | 4/2015 | Geiger et al. |
| 2016/0345681 | A1 | 12/2016 | Pheil et al. |
| 2017/0265571 | A1 | 9/2017 | Beers et al. |
| 2017/0265577 | A1 | 9/2017 | Schneider |
| 2017/0265579 | A1 | 9/2017 | Schneider et al. |
| 2017/0265581 | A1 | 9/2017 | Chang |
| 2017/0265586 | A1 | 9/2017 | Schneider et al. |
| 2017/0265591 | A1 | 9/2017 | Schneider |
| 2017/0265593 | A1 | 9/2017 | Schneider et al. |
| 2017/0265594 | A1 | 9/2017 | Walker et al. |
| 2017/0267485 | A1 | 9/2017 | Schneider et al. |
| 2017/0272008 | A1 | 9/2017 | Schneider |
| 2018/0199671 | A1 | 7/2018 | Schneider et al. |
| 2018/0199674 | A1 | 7/2018 | Walker et al. |
| 2018/0343977 | A1 | 12/2018 | Riccomini et al. |
| 2019/0104808 | A1 | 4/2019 | Kovach et al. |
| 2019/0116937 | A1 | 4/2019 | Avar et al. |
| 2020/0170331 | A1 | 6/2020 | Donohoe |
| 2020/0170351 | A1 | 6/2020 | Donohoe et al. |
| 2024/0081468 | A1 | 3/2024 | Donohoe |

FOREIGN PATENT DOCUMENTS

| | | |
|---|---|---|
| CN | 206238563 | 6/2017 |
| CN | 113163890 | 7/2021 |
| CN | 113163903 | 7/2021 |
| CN | 114631667 | 6/2022 |
| CN | 113163903 B | 4/2024 |
| EP | 2388556 | 11/2011 |
| EP | 3886630 | 9/2023 |
| EP | 3886639 | 9/2023 |
| JP | S5629467 | 3/1981 |
| JP | H04210753 A | 7/1992 |
| JP | 105203464 | 8/1993 |
| JP | 2002277286 | 9/2002 |
| JP | 2005308483 | 11/2005 |
| JP | 2007327912 | 12/2007 |
| JP | 2022508290 | 1/2022 |
| JP | 2022511460 | 1/2022 |
| JP | 7196305 | 12/2022 |
| JP | 202330017 | 3/2023 |
| JP | 7404366 B2 | 12/2023 |
| JP | 2024028963 A | 3/2024 |
| KR | 20170001249 | 1/2017 |
| KR | 20210068146 | 6/2021 |
| KR | 20210087061 | 7/2021 |
| KR | 102373735 | 3/2022 |
| KR | 20220038502 | 3/2022 |
| KR | 102489210 | 1/2023 |
| KR | 20230014849 | 1/2023 |
| KR | 102656033 B1 | 4/2024 |
| KR | 20240046811 A | 4/2024 |
| TW | 200811845 | 3/2008 |
| WO | 02098256 | 12/2002 |
| WO | 2016195957 | 12/2016 |
| WO | 2017160558 | 9/2017 |
| WO | 2017160561 | 9/2017 |
| WO | 2017161000 | 9/2017 |
| WO | 2020112637 | 6/2020 |
| WO | 2020112638 | 6/2020 |
| WO | 2020217178 | 10/2020 |

OTHER PUBLICATIONS

"U.S. Appl. No. 16/694,306, Non Final Office Action mailed Jan. 23, 2023", 8 pgs.

"Chinese Application Serial No. 201980078402.4, Office Action mailed Jan. 19, 2023", With English machine translation, 12 pgs.

"European Application Serial No. 19889528.6, Response filed Jan. 26, 2023 to Extended European Search Report mailed Jul. 7, 2022", 29 pgs.

"Korean Application Serial No. 10-2023-7001267, Voluntary Amendment filed Feb. 2, 2023", w English claims, 20 pgs.

"European Application Serial No. 19888492.6, Response filed Jan. 31, 2023 to Extended European Search Report mailed Jul. 7, 2022", 29 pgs.

"Chinese Application Serial No. 201980078402.4, Response filed Mar. 20, 2023 to Office Action mailed Jan. 19, 2023", w English claims, 29 pgs.

"Chinese Application Serial No. 201980078402.4, Response filed Aug. 14, 2023 to Office Action mailed May 29, 2023", w English claims (not amended), 10 pgs.

"Chinese Application Serial No. 201980078402.4, Decision of Rejection mailed Sep. 25, 2023", With English machine translation, 16 pgs.

"U.S. Appl. No. 16/694,306, Corrected Notice of Allowability mailed Oct. 20, 2023", 2 pgs.

"Korean Application Serial No. 10-2023-7001267, Notice of Preliminary Rejection mailed Oct. 26, 2023", With English machine translation, 8 pgs.

(56) References Cited

OTHER PUBLICATIONS

"International Application Serial No. PCT US2019 063009, International Search Report mailed Mar. 11, 2020", 4 pgs.
"International Application Serial No. PCT US2019 063009, Written Opinion mailed Mar. 11, 2020", 4 pgs.
"International Application Serial No. PCT US2019 063012, International Search Report mailed Apr. 22, 2020", 4 pgs.
"International Application Serial No. PCT US2019 063012, Written Opinion mailed Apr. 22, 2020", 4 pgs.
"International Application Serial No. PCT US2019 063009, International Preliminary Report on Patentability mailed Jun. 10, 2021", 6 pages.
"International Application Serial No. PCT US2019 063012, International Preliminary Report on Patentability mailed Jun. 10, 2021", 6 pages.
"U.S. Appl. No. 16/694,327, Restriction Requirement mailed Sep. 7, 2021", 7 pgs.
"Korean Application Serial No. 10-2021-7016459, Notice of Preliminary Rejection mailed Sep. 1, 2021", With English translation, 5 pages.
"U.S. Appl. No. 16/694,327, Response filed Nov. 8, 2021 to Restriction Requirement mailed Sep. 7, 2021", 7 pgs.
"Korean Application Serial No. 10-2021-7016459, Response filed Nov. 25, 2021 to Notice of Preliminary Rejection mailed Sep. 1, 2021", w English claims, 11 pgs.
"Japanese Application Serial No. 2021-531013, Notification of Reasons for Refusal mailed Jan. 4, 2022", With Concise Statement, 4 pgs.
"European Application Serial No. 19888492.6, Response To Communication Pursuant to Rules 161 and 162 EPC filed Dec. 22, 2021", 12 pgs.
"European Application Serial No. 19889528.6, Response To Communication Pursuant to Rules 161 and 162 EPC filed Dec. 22, 2021", 12 pgs.
"U.S. Appl. No. 16/694,327, Restriction Requirement mailed Jan. 13, 2022", 6 pgs.
"Japanese Application Serial No. 2021-531013, Response filed Mar. 7, 2022 to Notification of Reasons for Refusal mailed Jan. 4, 2022", w English claims, 17 pgs.
"U.S. Appl. No. 16/694,327, Response filed Apr. 13, 2022 to Restriction Requirement mailed Jan. 13, 2022", 7 pgs.
"U.S. Appl. No. 16/694,306, Restriction Requirement mailed May 13, 2022", 7 pgs.
"U.S. Appl. No. 16/694,327, Notice of Allowance mailed Jun. 7, 2022", 7 pgs.
"Japanese Application Serial No. 2021-531013, Notification of Reasons for Rejection mailed Jun. 7, 2022", W English Translation, 5 pgs.
"U.S. Appl. No. 16/694,306, Response filed Jul. 12, 2022 to Restriction Requirement mailed May 13, 2022", 7 pgs.
"European Application Serial No. 19888492.6, Extended European Search Report mailed Jul. 7, 2022", 8 pgs.
"European Application Serial No. 19889528.6, Extended European Search Report mailed Jul. 7, 2022", 9 pgs.
"Chinese Application Serial No. 201980078402.4, Office Action mailed Jul. 1, 2022", w English translation, 17 pgs.
"Korean Application Serial No. 10-2022-7007618, Notice of Preliminary Rejection mailed Aug. 9, 2022", w English translation, 6 pgs.
"U.S. Appl. No. 16/694,327, Corrected Notice of Allowability mailed Sep. 20, 2022", 4 pgs.
"Japanese Application Serial No. 2021-531013, Response filed Sep. 6, 2022 to Notification of Reasons for Rejection mailed Jun. 7, 2022", w English Claims, 13 pgs.
"Korean Application Serial No. 10-2022-7007618, Response filed Oct. 6, 2022 to Notice of Preliminary Rejection mailed Aug. 9, 2022", w English claims, 13 pgs.
"U.S. Appl. No. 16/694,306, Response filed Apr. 24, 2023 to Non Final Office Action mailed Jan. 23, 2023", 6 pgs.
"Japanese Application Serial No. 2022-199569, Voluntary Amendment filed Mar. 30, 2023", w English claims, 13 pgs.
"Chinese Application Serial No. 201980078402.4, Office Action mailed May 29, 2023", With English machine translation, 13 pgs.
"U.S. Appl. No. 16/694,306, Notice of Allowance mailed Jul. 3, 2023", 5 pgs.
"Chinese Application Serial No. 201980078402.4, Response filed Jan. 10, 2024 to Decision of Rejection mailed Sep. 25, 2023", w/ current English claims, 16 pgs.
"Chinese Application Serial No. 201980078402.4, Response to Examiner Telephone Interview filed Jan. 29, 2024", w/ current English claims, 9 pgs.
"European Application Serial No. 21764302.2, Extended European Search Report mailed Feb. 19, 2024", 7 pgs.
"European Application Serial No. 23196976.7, Extended European Search Report mailed Feb. 20, 2024", 9 pgs.
"European Application Serial No. 23196976.7, Response Filed Nov. 29, 2023 to Invitation to Remedy Deficiencies (R.58 EPC) mailed on Sep. 25, 2023", 6 pgs.
"European Application Serial No. 23201402.7, Response Filed Nov. 22, 2023 to Invitation to Remedy Deficiencies (R.58 EPC) mailed on Sep. 20, 2023", 8 pgs.
"Japanese Application Serial No. 2022-199569, Notification of Reasons for Refusal mailed Nov. 28, 2023", With English Machine Translation, 9 pgs.
"Japanese Application Serial No. 2022-199569, Response filed May 24, 2024 to Notification of Reasons for Refusal mailed Nov. 28, 2023", w/ English claims, 14 pgs.
"Japanese Application Serial No. 2023-210151, Voluntary Amendment filed Jan. 4, 2024", w/ English claims, 8 pgs.
"Korean Application Serial No. 10-2023-7001267, Response filed Dec. 26, 2023 to Notice of Preliminary Rejection mailed Oct. 26, 2023", w/ current English claims, 17 pgs.
U.S. Appl. No. 18/514,057, filed Nov. 20, 2023, Autolacing Footwear Motor Having Force-Directing Supports.
"European Application Serial No. 23196406.5, Response filed Sep. 19, 2024 to Extended European Search Report mailed Feb. 19, 2024", 46 pgs.
"European Application Serial No. 23196976.7, Response filed Sep. 19, 2024 to Extended European Search Report mailed Feb. 20, 2024", 55 pgs.
"Chinese Application Serial No. 202210086648.X, Response filed Oct. 22, 2024 to Office Action mailed Jun. 22, 2024", w current English claims, 29 pgs.
"Korean Application Serial No. 10-2021-7016449, Notice of Preliminary Rejection mailed Oct. 16, 2024", w English translation, 7 pgs.

* cited by examiner

AUTOLACING FOOTWEAR MOTOR HAVING ROTARY DRUM ENCODER

PRIORITY APPLICATIONS

This application is a continuation of U.S. patent application Ser. No. 16/694,327, filed Nov. 25, 2019, which application claims the benefit of priority to U.S. Provisional Application Ser. No. 62/773,842, filed Nov. 30, 2018 and U.S. Provisional Application Ser. No. 62/773,867, filed Nov. 30, 2018, the contents of which are incorporated herein by reference in their entireties.

TECHNICAL FIELD

The subject matter disclosed herein generally relates to an article of footwear having an autolacing motor and a rotary drum encoder.

BACKGROUND

Articles of footwear, such as shoes, may include a variety of components, both conventional and unconventional. Conventional components may include an upper, a sole, and laces or other securing mechanisms to enclose and secure the foot of a wearer within the article of footwear. Unconventionally, a motorized lacing system may engage with the lace to tighten and/or loosen the lace. Additional or alternative electronics may provide a variety of functionality for the article of footwear, including operating and driving the motor, sensing information about the nature of the article of footwear, providing lighted displays and/or other sensory stimuli, and so forth.

BRIEF DESCRIPTION OF THE DRAWINGS

Some embodiments are illustrated by way of example and not limitation in the figures of the accompanying drawings.

DETAILED DESCRIPTION

Example methods and systems are directed to an article of footwear having a rotary drum encoder. Examples merely typify possible variations. Unless explicitly stated otherwise, components and functions are optional and may be combined or subdivided, and operations may vary in sequence or be combined or subdivided. In the following description, for purposes of explanation, numerous specific details are set forth to provide a thorough understanding of example embodiments. It will be evident to one skilled in the art, however, that the present subject matter may be practiced without these specific details.

In general, and particularly for articles of footwear oriented toward the performance of athletic activities, characteristics such as the size, form, robustness, and weight of the article of footwear may be of particular importance. Where the components of the article of footwear promote, for instance, a relatively tall, heavy, and/or fragile article of footwear, the capacity of the article of footwear to be effective in the performance of the athletic activity may be compromised.

One type of component that may be utilized within the context of electronics of an article of footwear, including within the motorized lacing system, is an optical encoder. An optical encoder may be utilized to track rotational movement of the motor and/or, e.g., a spool coupled to the motor and on which the lace is wound and unwound. By tracking the revolutions of the motor and/or the spool, a controller may obtain information about how much more the motor and/or spool may be turned to achieve a desired configuration of the lace. However, conventional optical encoders may create issues for the article of footwear such as those described above, including having a relatively high stack up and being relatively fragile.

Conventional optical encoders may be planar, e.g., a circle. The optical encoder may spin on an axis of the circle and an optical sensor positioned above or below the circle may sense the passage of the portions of the encoder. A three-dimensional optical encoder has been developed in the general shape of a drum or cylinder. As will be described in detail herein, the three-dimensional optical encoder may provide both ease of manufacture as well as an implementation that is both more compact than a conventional two-dimensional optical encoder and greater robustness.

Figure 1:
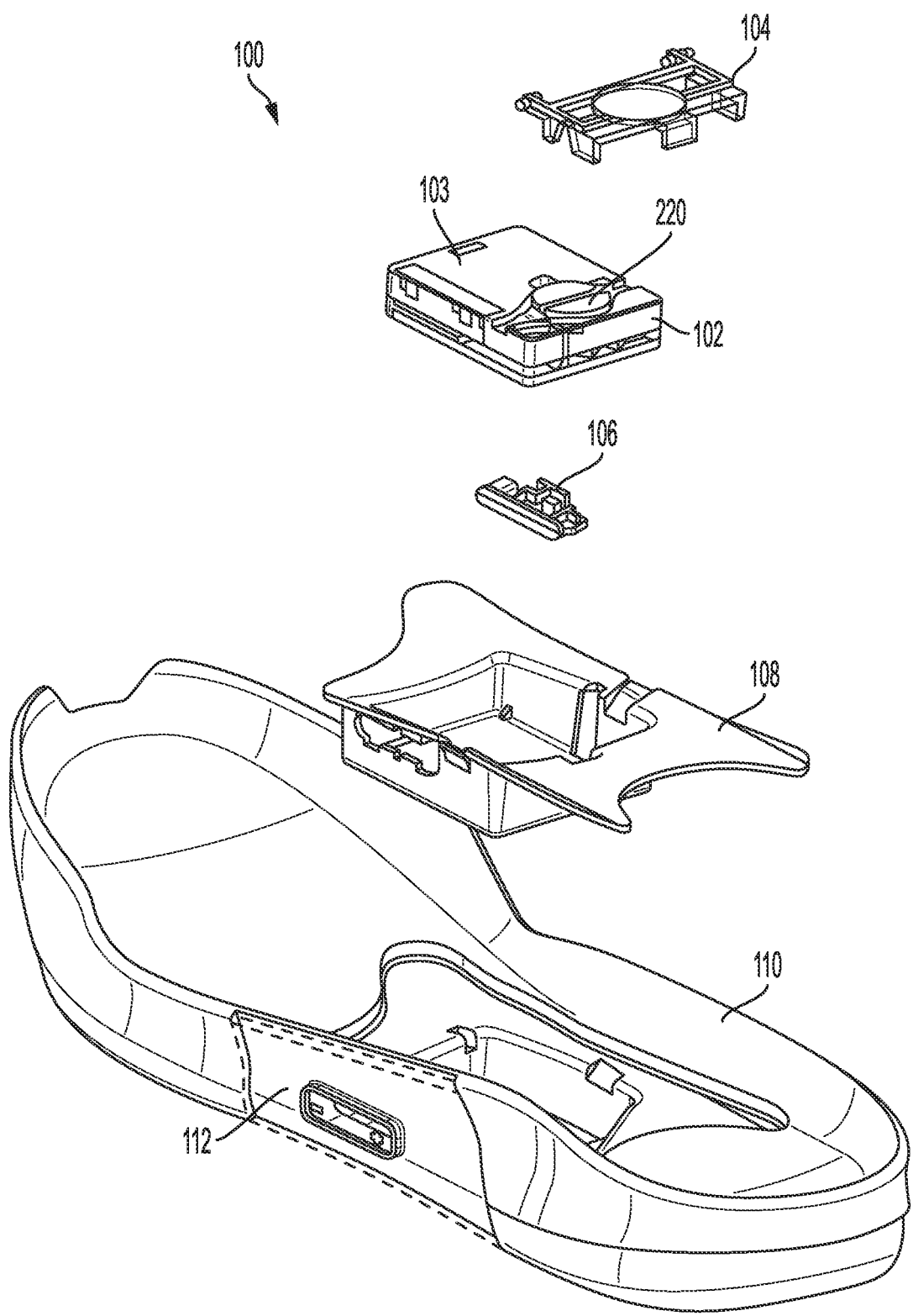
FIG. 1 is an exploded view illustration of components of a motorized lacing system for an article of footwear, in an example embodiment.

FIG. 1 is an exploded view illustration of components of a motorized lacing system for an article of footwear, in an example embodiment. While the system is described with respect to the article of footwear, it is to be recognized and understood that the principles described with respect to the article of footwear apply equally well to any of a variety of wearable articles. The motorized lacing system 100 illustrated in FIG. 1 includes a lacing engine 102 having a housing structure 103, a lid 104, an actuator 106, a mid-sole plate 108, a mid-sole 110, and an outsole 112. FIG. 1 illustrates the basic assembly sequence of components of an automated lacing footwear platform. The motorized lacing system 100 starts with the mid-sole plate 108 being secured within the mid-sole. Next, the actuator 106 is inserted into an opening in the lateral side of the mid-sole plate opposite to interface buttons that can be embedded in the outsole 112. Next, the lacing engine 102 is dropped into the mid-sole plate 108. In an example, the lacing system 100 is inserted under a continuous loop of lacing cable and the lacing cable is aligned with a spool in the lacing engine 102 (discussed below). Finally, the lid 104 is inserted into grooves in the mid-sole plate 108, secured into a closed position, and latched into a recess in the mid-sole plate 108. The lid 104 can capture the lacing engine 102 and can assist in maintaining alignment of a lacing cable during operation.

Figure 2:
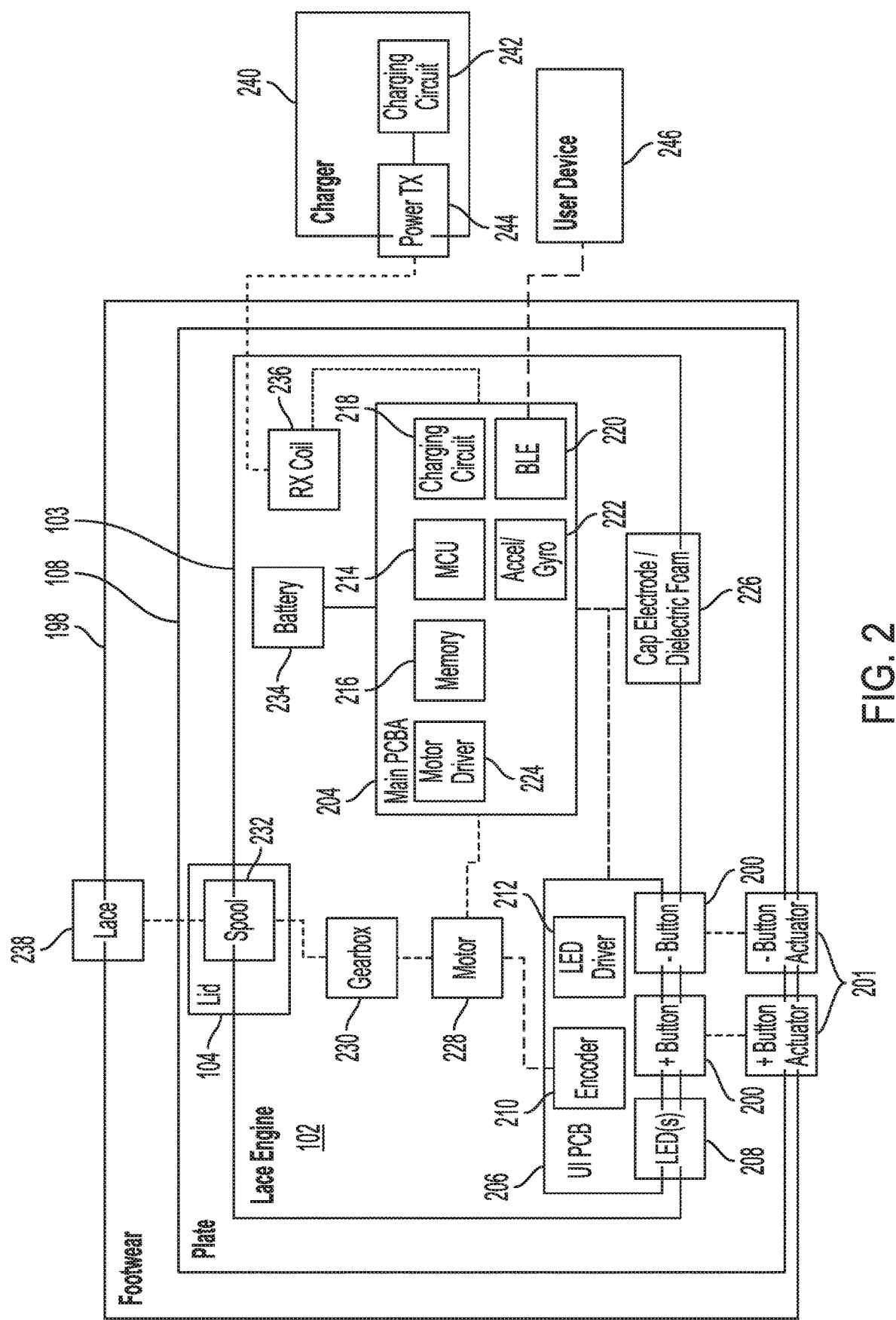
FIG. 2 illustrates generally a block diagram of components of a motorized lacing system, in an example embodiment.

FIG. 2 illustrates generally a block diagram of components of a motorized lacing system 100, in an example embodiment. The system 100 includes some, but not necessarily all, components of a motorized lacing system, including the lacing engine 102, the mid-sole plate 108, and the underlying footwear 198. The system 100 as illustrated includes interface buttons 200, interface button actuators 201, a foot presence sensor 202, and the lacing engine housing 103 enclosing a main PCB 204 and a user interface PCB 206. The user interface PCB 206 includes the buttons 200, one or more light emitting diodes (LEDs) 208 which may illuminate the button actuators 201 or otherwise provide illumination visible outside of the article of footwear, an optical encoder unit 210, and an LED driver 212 which may provide power to the LEDs 208. The main PCB 204 includes a processor circuit 214, an electronic data storage 216, a battery charging circuit 218, a wireless transceiver 220, one or more sensors 222, such as accelerometers, gyroscopes, and the like, and a motor driver 224.

The lacing engine 102 further includes a foot presence sensor 226, such as a capacitive sensor, a motor 228, a transmission 230, a spool 232, a battery or power source 234, and a charging coil 236. The processor circuit 214 is configured with instructions from the electronic data storage 216 to cause motor driver 224 to activate the motor 228 to turn the spool 232 by way of the transmission 230 in order to place a desired amount of tension on a lace 238 wound about the spool 232. The processor circuit 214 may receive inputs from a variety of sources, including the foot presence sensor 226, the sensors 222, and the buttons 200, to decide, according to the instructions, to increase or decrease the tension on the lace 238. For instance, the foot presence sensor 226 may detect the presence of a foot in the footwear 198, and the processor circuit 216 may set the tension to a present tension level. The sensors 222 may detect movement consistent with a particular activity level, e.g., causal walking, a vigorous physical activity, etc., and the processor circuit 214 may cause the tension to be set to a level consistent with that activity level, e.g., relatively loose for casual walking and relatively tight for vigorous physical activity. A user may press the button actuators 201 to manually command an incremental or linear increase or decrease in tension as desired.

The battery 234 provides power for the components of the lacing engine 102 in general and is, in the example embodiment, a rechargeable battery. However, alternative power sources, such as non-rechargeable batteries, super capacitors, and the like, are also contemplated. In the illustrated example, the battery 234 is coupled to the charging circuit 218 and the recharge coil 236. When the recharge coil 236 is placed in proximity of an external charger 240, a charging circuit 242 may energize a transmit coil 244 to inductively induce a current in the recharge coil 236, which is then utilized by the charging circuit 218 to recharge the battery 234. Alternative recharging mechanisms are contemplated, such as a piezoelectric generator located within the footwear 198.

The wireless transceiver 220 is configured to communicate wirelessly with a remote user device 246, such as a smartphone, wearable device, tablet computer, personal computer, and the like. In example, the wireless transceiver 220 is configured to communicate according to the Bluetooth Low Energy modality, though the wireless transceiver 220 may communicate according to any suitable wireless modality, including near field communication (NFC), 802.11 WiFi, and the like. Moreover, the wireless transceiver 220 may be configured to communicate with multiple external user devices 246 and/or according to multiple different wireless modalities. The wireless transceiver 220 may receive instructions from the user device 246, e.g., using an application operating on the user device 246, for controlling the lacing engine 102, including to enter predetermined modes of operation or to incrementally or linearly increase or decrease the tension on the lace 238. The wireless transceiver 220 may further transmit information about the lace engine 102 to the user device 246, e.g., an amount of tension on the lace 238 or otherwise an orientation of the spool 232, an amount of charge remaining on the battery 234, and any other desired information about the lacing engine 102 generally.

Figure 3A:
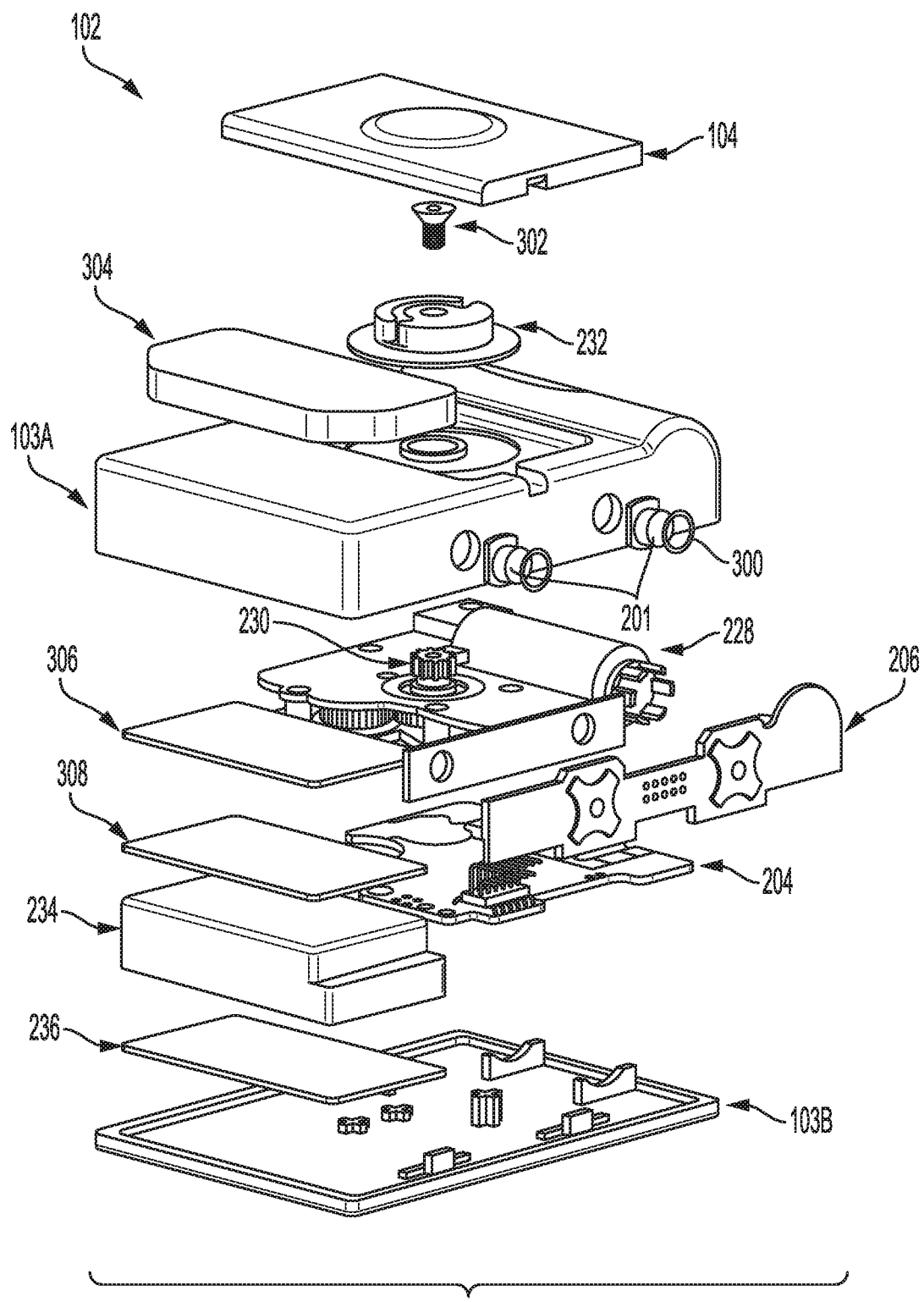
FIG. 3A is an exploded view of the lacing engine, in an example embodiment.

FIG. 3A is an exploded view of the lacing engine 102, in an example embodiment. The lacing engine 102 includes the housing 103, which includes an upper portion 103A and a lower portion 103B, which enclose the lacing engine 102 generally, except for certain components which are exterior of the housing 103. Those components include the button actuators 201 (and related O-rings 300 for protecting the lacing engine 102 against environmental conditions, such as moisture), the spool 232, which is secured to the transmission 230 via a setscrew 302 and which is enclosed with the lid 104, and a dielectric foam 304 of the foot presence sensor 226. Enclosed within the housing 103 is the main PCB 204, the user interface PCB 206, the motor 228, the transmission 230, the battery 234, the recharge coil 236, and an electrode 306 and foam 308 of the foot presence sensor 226.

Partially visible in the exploded view is the optical encoder unit 210. Specifically, a three-dimensional encoder 310 of the optical encoder unit 210 is coupled to the motor 228 and turns with the turning of the motor. Specific implementations of the three-dimensional encoder 310 are illustrated herein.

Figure 3B:
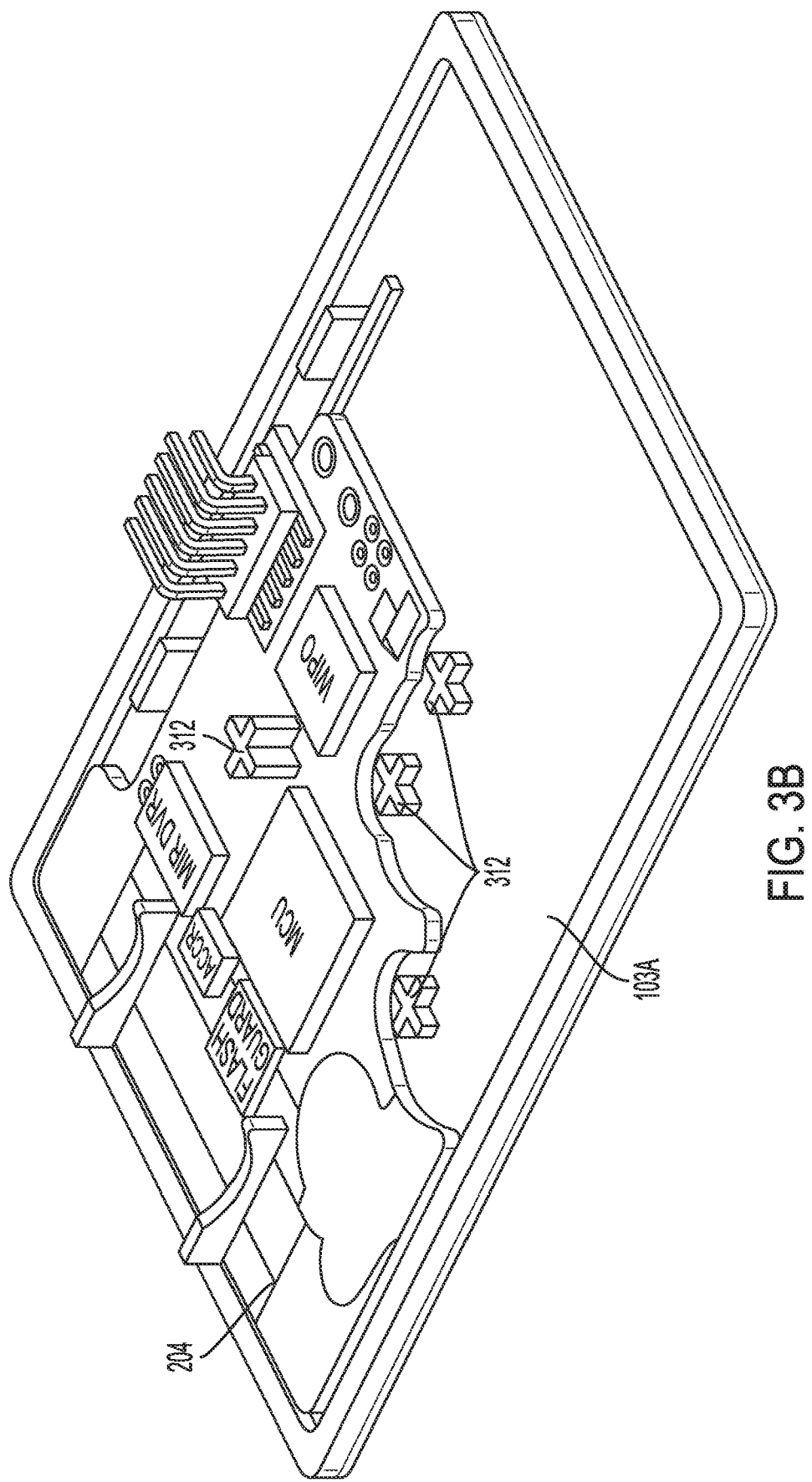
FIG. 3B is a view of the lower portion of the housing in relation to the main PCB.

FIG. 3B is a view of the lower portion 103B of the housing 103 in relation to the main PCB 204. Included in the lower portion 103B are posts 312 extending from in interior surface 314 of the lower portion 103B of the housing 103. As will be illustrated herein, at least one of the posts 312 extend through a hole in the main PCB 204 (not visible). When an external force is placed on the exterior of the lower portion 103B of the housing 103, e.g., because a wearer of the footwear 198 steps on an object that imparts force through the mid-sole 110 and plate 108 (FIG. 1), the lower portion 103B may flex. The posts 312 are positioned such that the flexing of the lower portion 103B may result in one or more of the posts 312 contacting a relatively more solid or resilient component of the lacing engine 102, e.g., the motor 228, the transmission 230, or the battery 234, rather than the a relatively less resilient component, such as the main PCB 204.

Figure 4A:
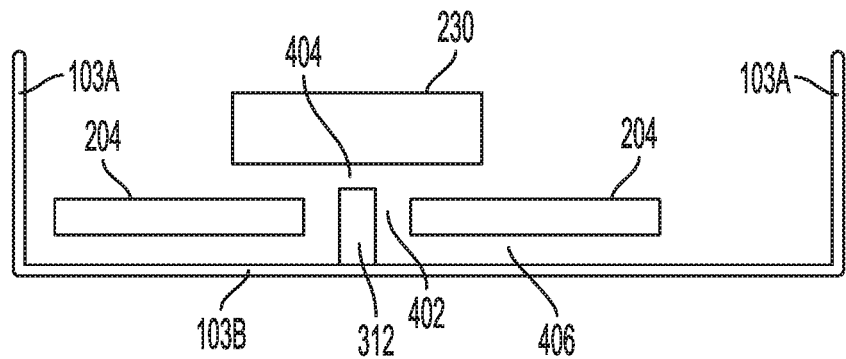
FIGS. 4A and 4B are sequential block diagrams illustrating the function of a post when a force is imparted on the lower portion, in an example embodiment.
Figure 4B:
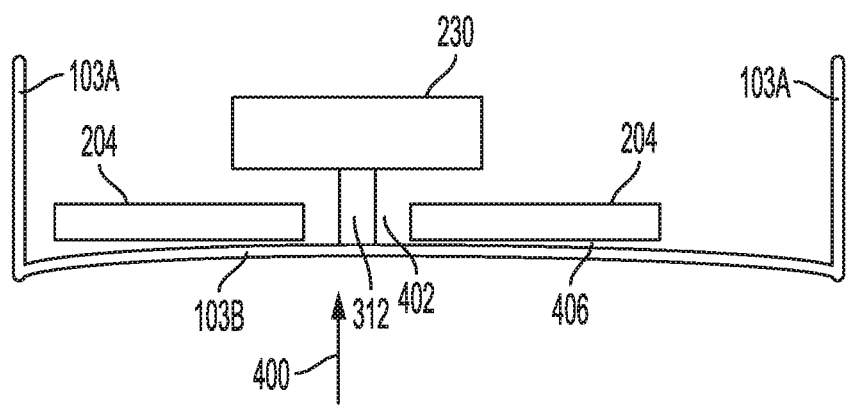

FIGS. 4A and 4B are sequential block diagrams illustrating the function of a post 312 when a force 400 is imparted on the lower portion 103B, in an example embodiment. The block diagram has been simplified and exaggerated for the purposes of illustration. It is to be recognized that multiple posts 312 may be implemented according to the principles illustrated herein across a variety of locations, as illustrated in FIG. 3B, and that the posts 312 may be positioned and configured to contact any suitable resilient component, as noted herein.

FIG. 4A shows the lower portion 103B coupled to the upper portion 103A with a post 312 projecting from the interior surface 314 of the lower portion 103B. The post 312 extends through a hole 402 formed in the main PCB 204. As illustrated, the post does not contact the transmission 230 but rather has a gap 404 therebetween. In various examples, the gap 404 is less than a gap 406 between the main PCB 204 and the interior surface 314. However, it is to be recognized that there may not be a gap 404 or that the gap 404 may be approximately the same as the gap 406. As no force has been imparted on the lower portion 103B, the lower portion 103B is substantially flat and linear.

FIG. 4B shows the lower portion 103B bowed on account of the force 400 imparted on the lower portion 103B. The bowing of the lower portion 103B has caused the post 312 to contact the transmission 230, transferring at least some of the force 400 to the transmission 230. While the gap 404 between the post 312 and the transmission 230 has been eliminated, at least some gap 406 remains between the interior surface 314 and the main PCB 204. As a result, in this example, no portion of the force 400 is imparted on the relatively fragile main PCB 204 and is instead imparted on the more resilient transmission 230.

It is to be recognized and understood that while the exaggerated illustration shows no contact between the lower portion 103B and the main PCB 204, actual implementations may nonetheless result in some contact between the lower portion 103B and the main PCB 204, and/or that at least some of the force 400 is imparted on the main PCB 204. However, at minimum, the presence of the post 312 may tend to cause at least some of the force 400 to be imparted on the transmission 230 rather than on to the main PCB 204. A relative reduction in the amount of force 400 imparted on the main PCB 204 than would be the case without the post 312 may still reduce a likelihood of the main PCB 204 being damage from imparted force 400 on the lower portion 103B.

Figure 5A:
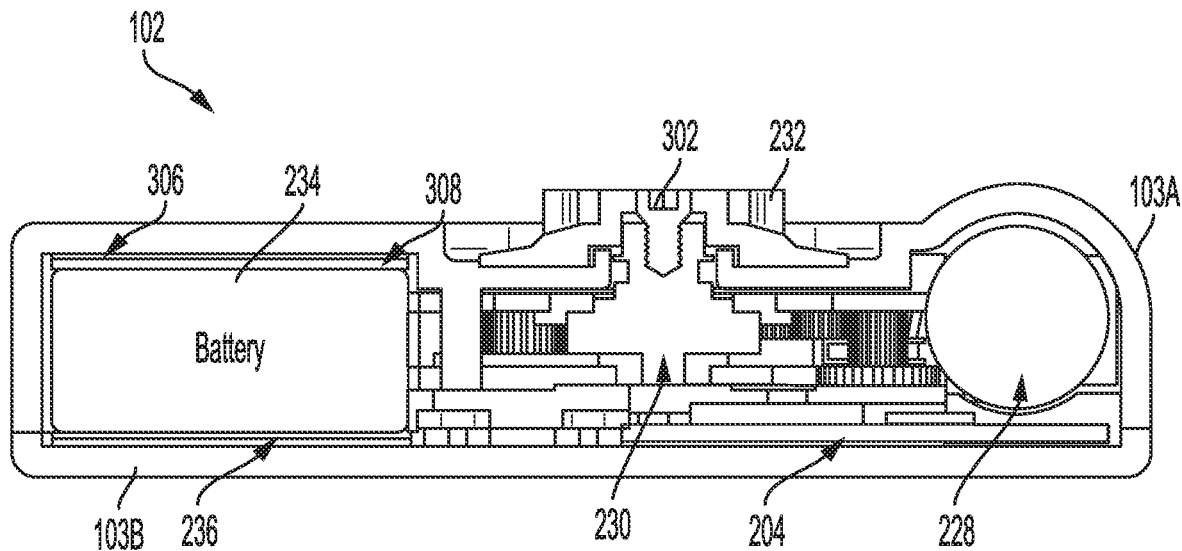
FIGS. 5A and 5B are side and perspective views of the lace engine, in an example embodiment.
Figure 5B:
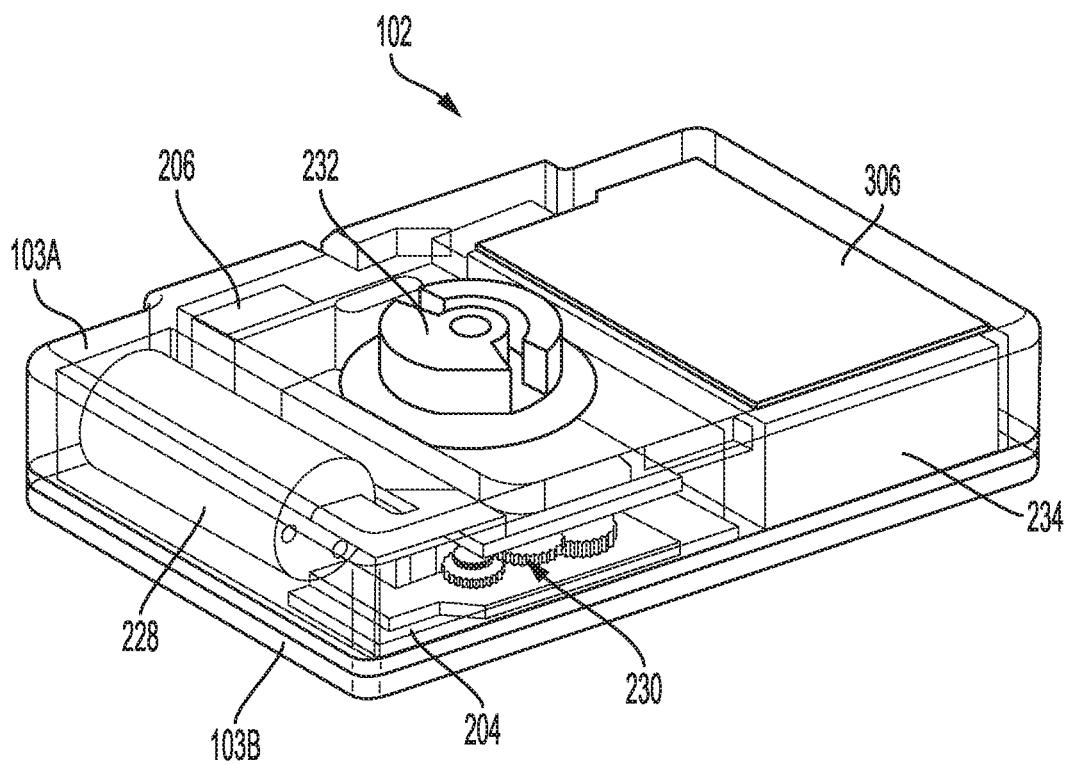

FIGS. 5A and 5B are side and perspective views of the lace engine 102, in an example embodiment. Components such as the main PCB 204, user interface PCB 206, motor 228, transmission 230, battery 234, electrode 306, foam 308, and recharge coil 236 are contained within the top portion 103A and bottom portion 103B of the housing 103. The spool 232 is secured to the transmission 230 via the set screw 302. The top portion 103A generally conforms to a curved contour of the motor 228.

In an example, the top portion 103A and bottom portion 103B are each approximately 1.5 millimeters thick. The recharge coil 236 is approximately 0.7 millimeters thick, including a ferrite backing. The battery 234 is approximately 7.5 millimeters thick, accounting for a swelling of the battery 234 over time. In an example, the electrode 306 is approximately 0.25 millimeters thick and the foam 308 is approximately 0.5 millimeters thick, providing for a total thickness of the lace engine 102 proximate the battery 234 of approximately 11.75 millimeters. In an example, the motor 228 is approximately 8.5 millimeters thick and the lace engine 102 proximate the motor 228 has a maximum thickness of approximately 14.55 millimeters. In an example, the lace engine 102 proximate the spool 232 has a thickens of approximately 14.7 millimeters.

Figure 6:
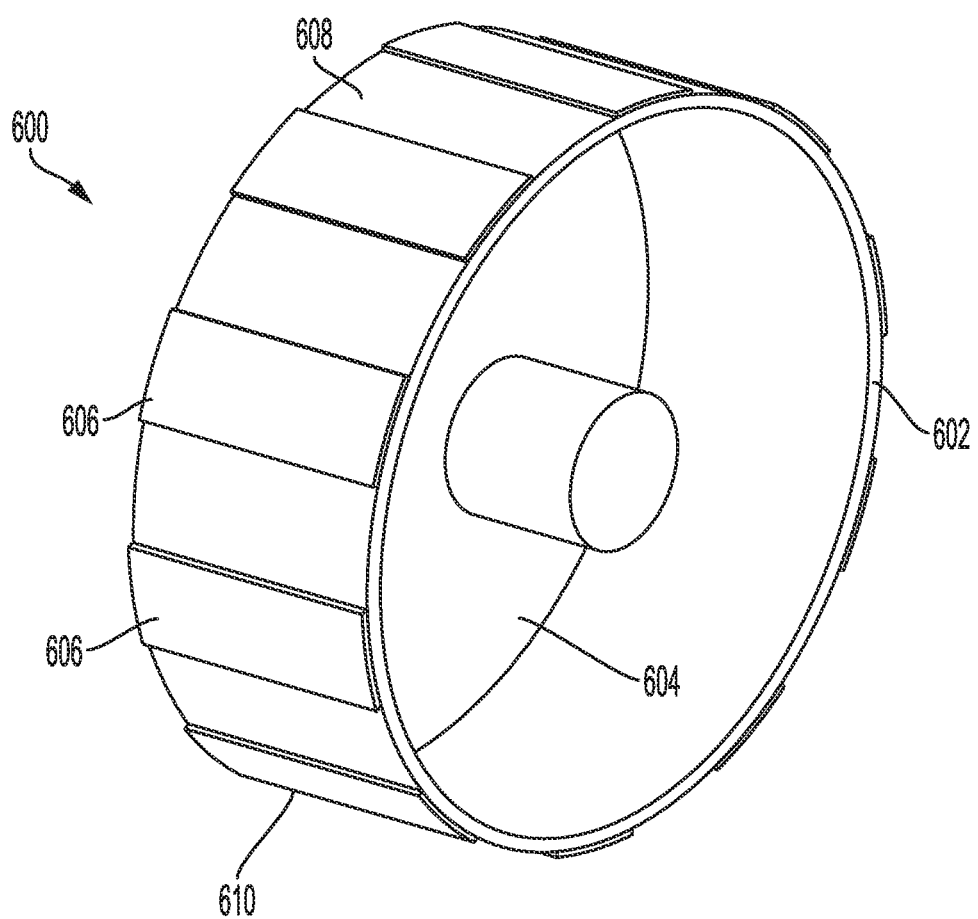
FIG. 6 is a depiction of a three-dimensional encoder, in an example embodiment.

FIG. 6 is a depiction of a three-dimensional encoder 600, in an example embodiment. The three-dimensional encoder 600 may function as the three-dimensional encoder 310 in the optical encoder unit 210. The three-dimensional encoder 600 is a drum encoder, including a drum portion 602 and a securing portion 604 coupled to the cylindrical portion and configured to secure the three-dimensional encoder 600 to e.g., a motor shaft. The securing portion may be solid or may be individual portions that extend between the drum portion 602 and the motor, e.g., spokes or the like.

As illustrated, the drum portion 602 is cylindrical and has a circular cross section, though any of a variety of suitable geometries are contemplated, including conical, octagonal, and the like. As with the two-dimensional disk 300, the drum 600 includes a first plurality of segments 606, e.g., dark segments, alternatingly positioned between a second plurality of segments 608, e.g., reflective segments. The first and second plurality of segments 606, 608 are positioned on an exterior surface 610 of the drum portion 602.

Figure 7:
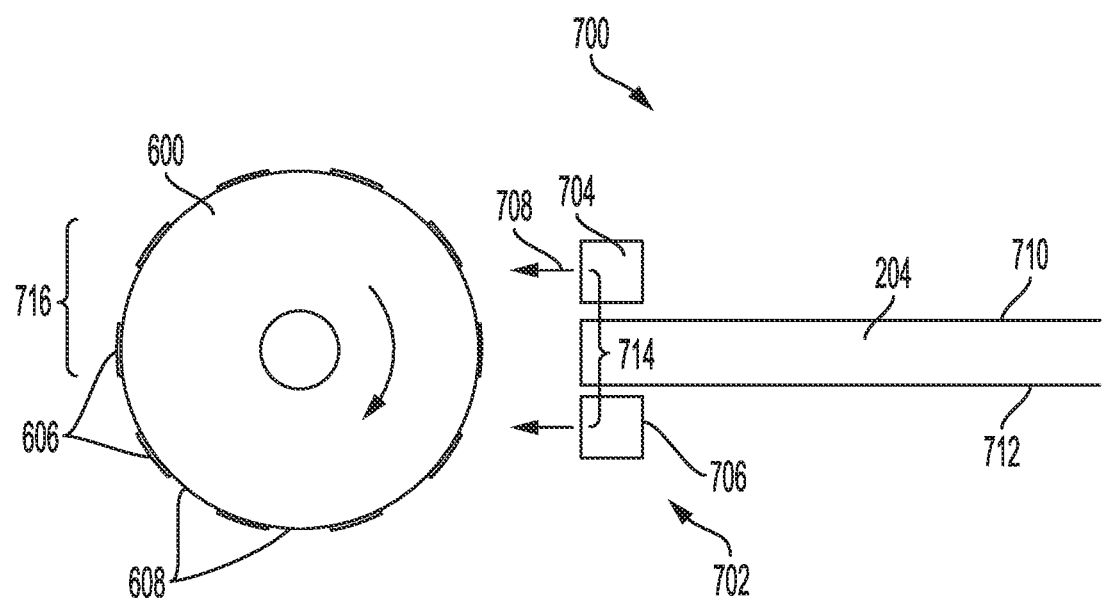
FIG. 7 is a depiction of an optical encoder, including the three-dimensional encoder, in an example embodiment.

FIG. 7 is a depiction of an optical encoder unit 700, including the three-dimensional encoder 600, in an example embodiment. The optical encoder 700 may operate as the optical encoder 210 in the block diagram of FIG. 2. In addition to the three-dimensional encoder 600, the optical encoder 700 includes an optical sensor 702, including a first optical sensor 704 and a second optical sensor 706 each within an optical range 708 of the three-dimensional encoder 600, the optical range 708 being a distance over which the first and second optical sensors 704, 706 can differentiate between the first and second plurality of segments 606, 608. As such, the optical range 708 will be different between and among different types of first and second optical sensors 704, 706. In the event that external design requirements may necessitate a specific distance between the optical sensor 702 and the three-dimensional encoder 600, first and second optical sensors 704, 706 may be selected that have an optical range 708 at least as long as the distance.

The first optical sensor 704 is positioned on a first major surface 710 of the main PCB 204 while the second optical sensor 708 is positioned on a second major surface 712 of the main PCB 204. In the illustrated example, the first and second optical sensors 704, 706 have a vertical spacing 714 approximately equal to a height 716 of each individual one of the first and second plurality of segments 606, 608, e.g., within approximately five (5) percent of the height 716. As such, each of the first and second optical sensors 704, 706 will both tend to detect the same type of segment, i.e., will both detect dark segments or reflective segments. If each of the first and second optical sensors 704, 706 do not detect the same type of segment, e.g., the first optical sensor 704 detects one of the first plurality of segments 606 and the second optical sensor 706 detects one of the second plurality of segments 608 (or vice versa), the inconsistency may be expected to be resolved soon in favor of both the first and second optical sensor 704, 706 detecting the same type of segment 606, 608.

While a particular configuration of the optical sensor 702 is illustrated, it noted and emphasized that the number and orientation of optical sensors may be varied between and among different implementations. Thus, in an example an alternative example of the optical sensor 702 may have only one individual optical sensor, while a further alternative example of the optical sensor 702 may include three or more individual optical sensors. However, in various examples, each optical sensor is positioned on one of the major surfaces 710, 712 of the main PCB 204.

Figure 8A:
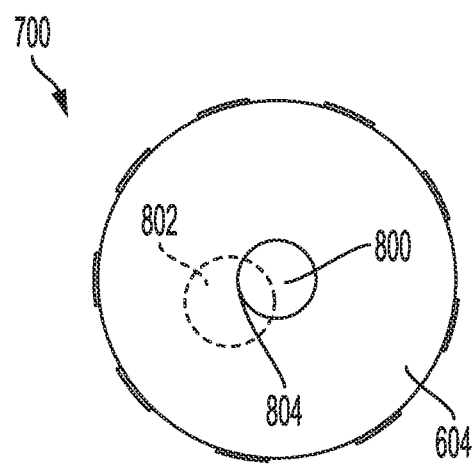
FIGS. 8A-8C illustrate the operation of an optical encoder which is off center relative to a major axis of the optical encoder, in an example embodiment.
Figure 8B:
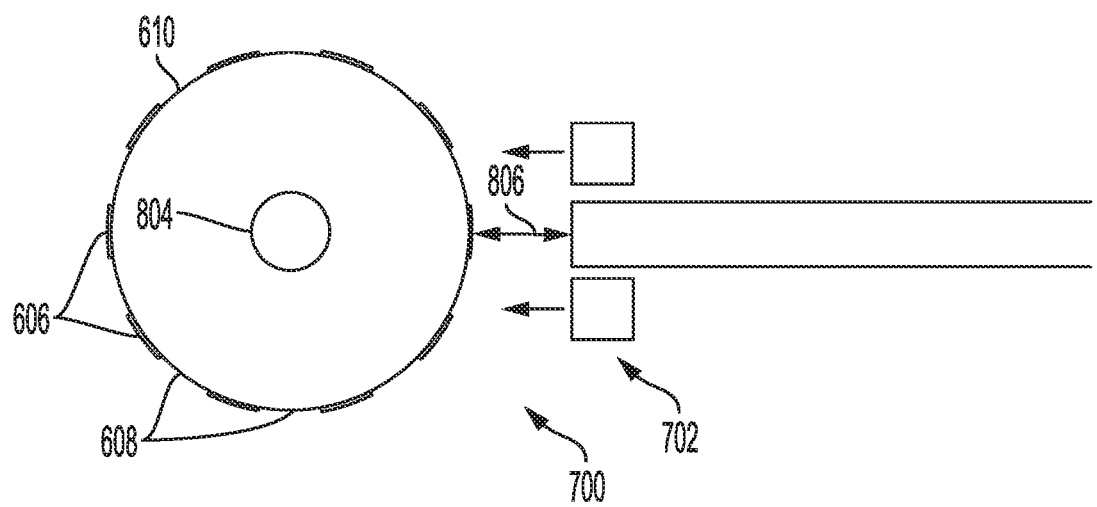
Figure 8C:
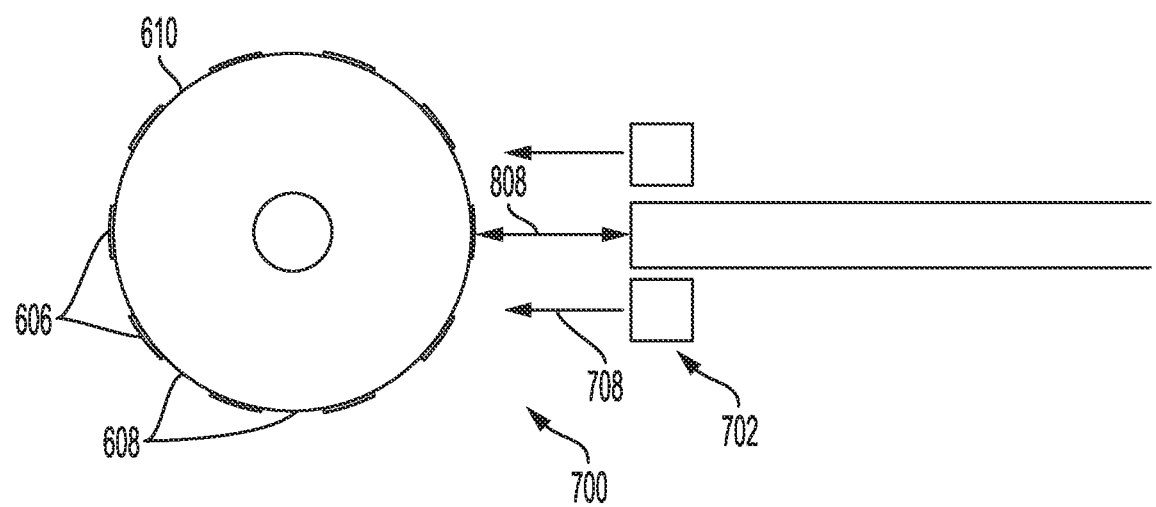

FIGS. 8A-8C illustrate the operation of an optical encoder unit 700 which is off center relative to a major axis 800 of the optical encoder 700, in an example embodiment. In FIG. 8A, a center 802 of an aperture 804 in the securing section 604 through which the motor shaft 306 may pass is offset by distance relative to the major axis 800. In FIG. 8B, with the aperture 804 fixed about the shaft, the exterior surface 610 and, by extension, the first and second plurality of segments 606, 608, come to within a first distance 806 of the optical sensor 702. In FIG. 8C, the optical encoder 700 having completed a half-rotation relative to in FIG. 8B, the exterior surface 610 comes to within a second distance 808 of the optical sensor 702, the second distance 808 being greater than the first distance 806, owing to the off-center aperture 804 being fixed about the motor shaft.

Offsets between the major axis 800 and the center 802 of the aperture may be an unintended consequence of a manufacture process. However, because of the properties of the optical sensor 700, the apparent height 716 (FIG. 7) of each of the first and second plurality of segments 606, 608 may remain the same. As a result, such concentricity issues may merely result in a difference in focal distance of the optical sensor 702. Differences in the focal distance may be resolved by the optical sensor 702 within the optical range 708 of the optical sensor 702. As such, the optical encoder 700 may allow for greater variance in a manufacturing process than may be allowed in a manufacturing process of the optical encoder 300, as well as be more robust to normal wear and tear during use.

Figure 9:
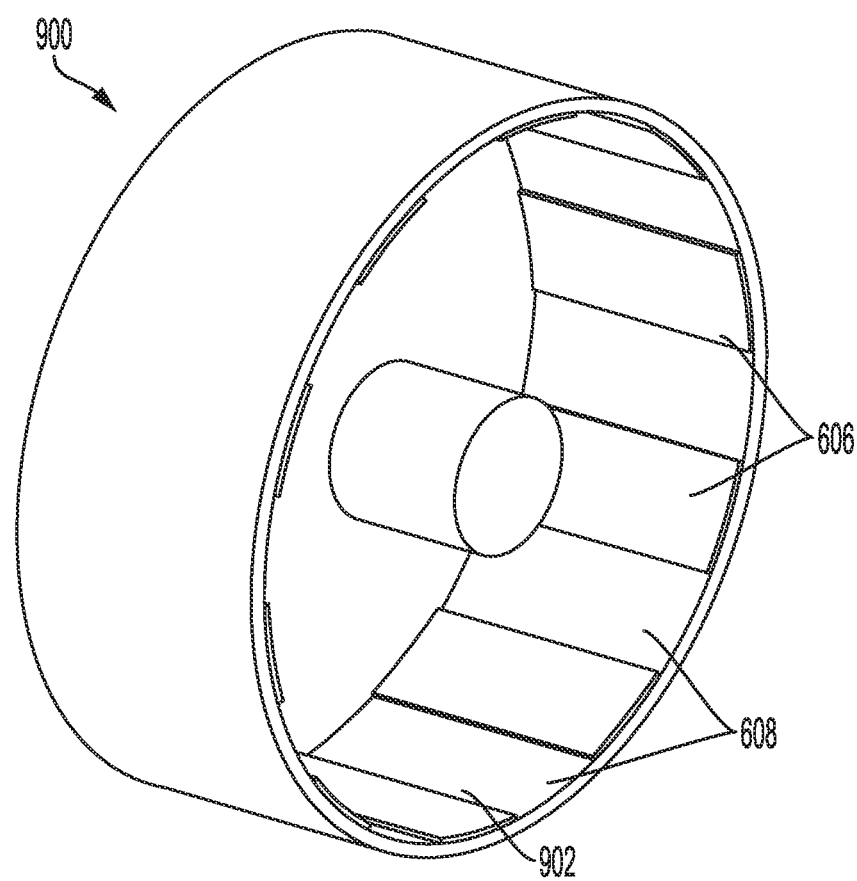
FIG. 9 is a depiction of an alternative example of a three-dimensional encoder, in an example embodiment.

FIG. 9 is a depiction of an alternative example of a three-dimensional encoder 900, in an example embodiment. The three-dimensional encoder 900 may otherwise have the same properties as the three-dimensional encoder 600. But rather than having the first and second plurality of segments 606, 608 on an outside surface of the drum portion 602, the three-dimensional encoder 900 includes the first and second plurality of segments 606, 608 on an interior surface 902. The three-dimensional encoder 900 may otherwise be utilized in an arrangement similar to that of the optical sensor 700, with the optical sensors 702 positioned to sense the interior surface 902.

Figure 10A:
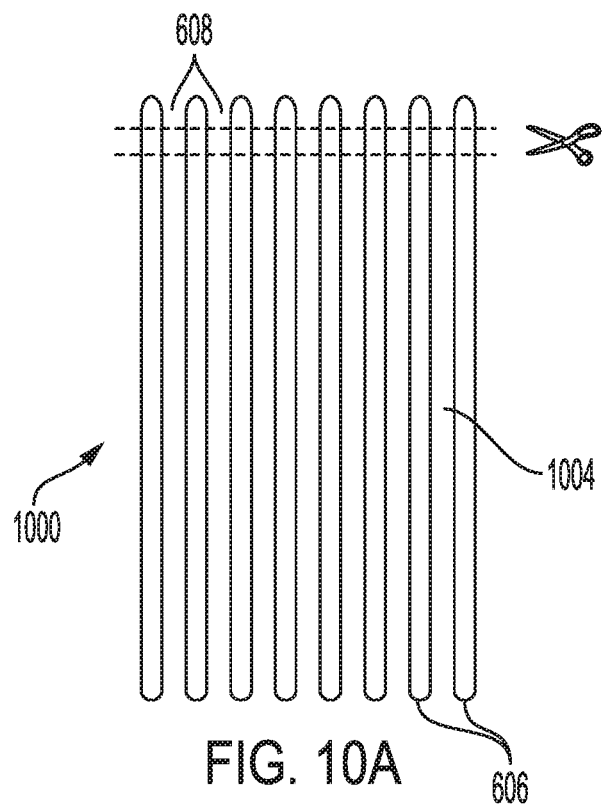
FIGS. 10A-10C illustrate a manufacturing process for the three-dimensional encoders, in an example embodiment.
Figure 10B:
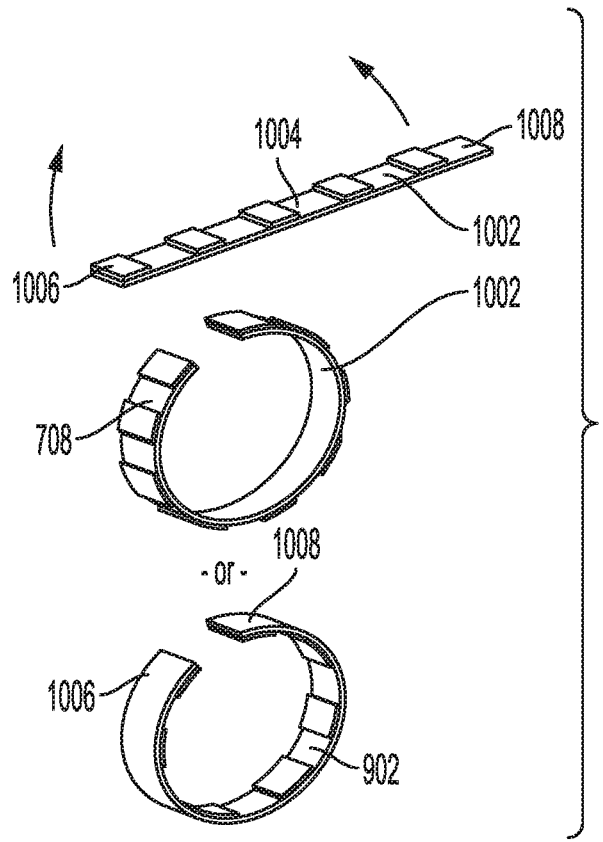
Figure 10C:
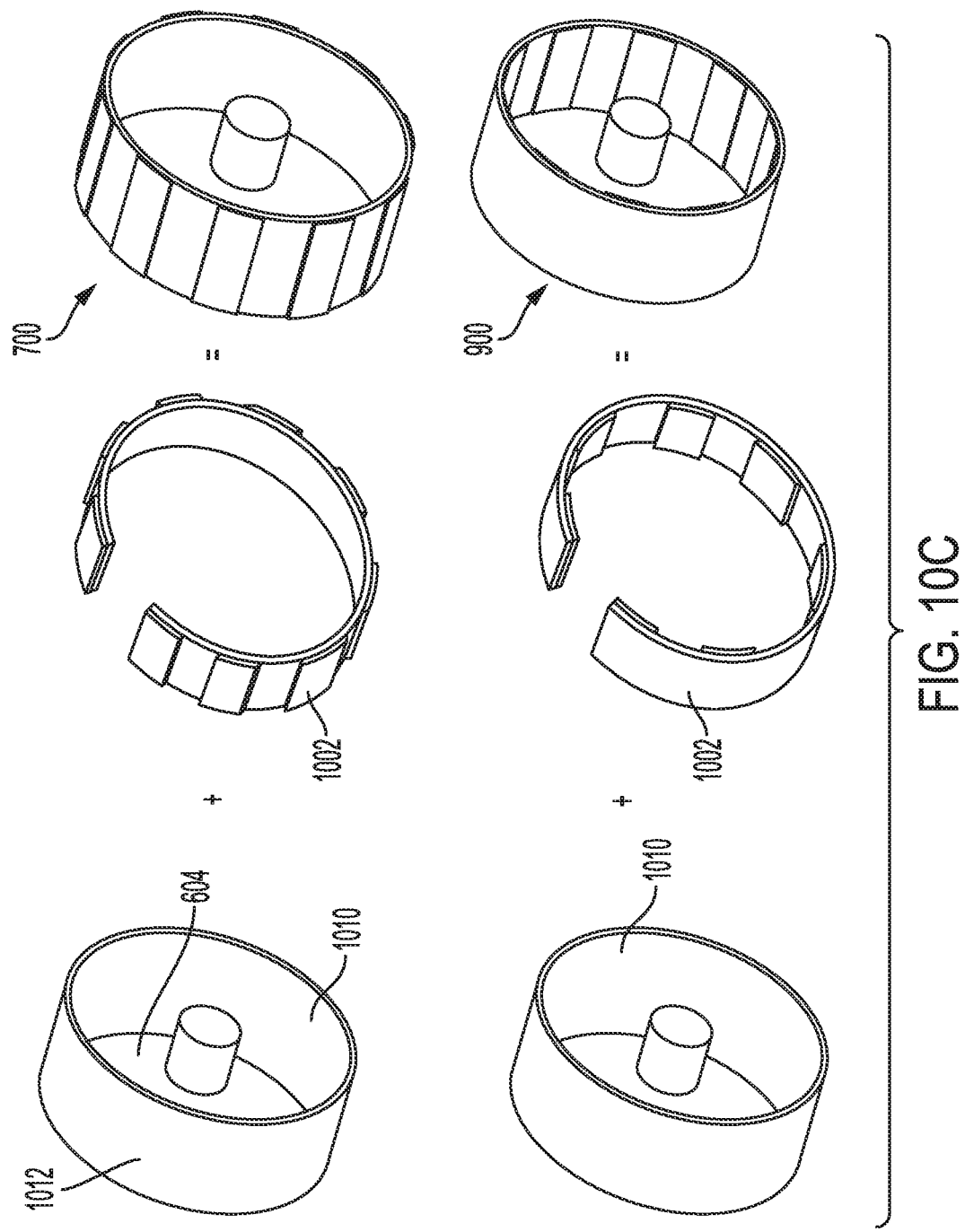

FIGS. 10A-10C illustrate a manufacturing process for the three-dimensional encoders 700, 900, in an example embodiment.

In FIG. 10A, a sheet 1000 of elongate first and second plurality of segments 606, 608 is cut into individual strips 1002. The sheet 1000 is made of any suitable material, such as Mylar, and the dark segments, e.g., the first plurality of segments 606, are printed onto a major surface 1004 of sheet 1000. The reflective segments, e.g., the second plurality of segments 608, are untreated or substantially untreated Mylar.

In FIG. 10B, the strip 1002 is folded so that the major surface 1004, i.e., the printed side, is either on an exterior surface 708 or an interior surface 902, as desired. A first end 1006 is secured to a second end 1008 to make a loop.

In FIG. 10C, the strip 1002 is coupled to a frame 1010 to form the three-dimensional encoder 700, 900, as desired. The frame 1010 includes the securing portion 604 and a drum 1012 on which to fix the strip 1002 to form the drum portion 602.

Figure 11:
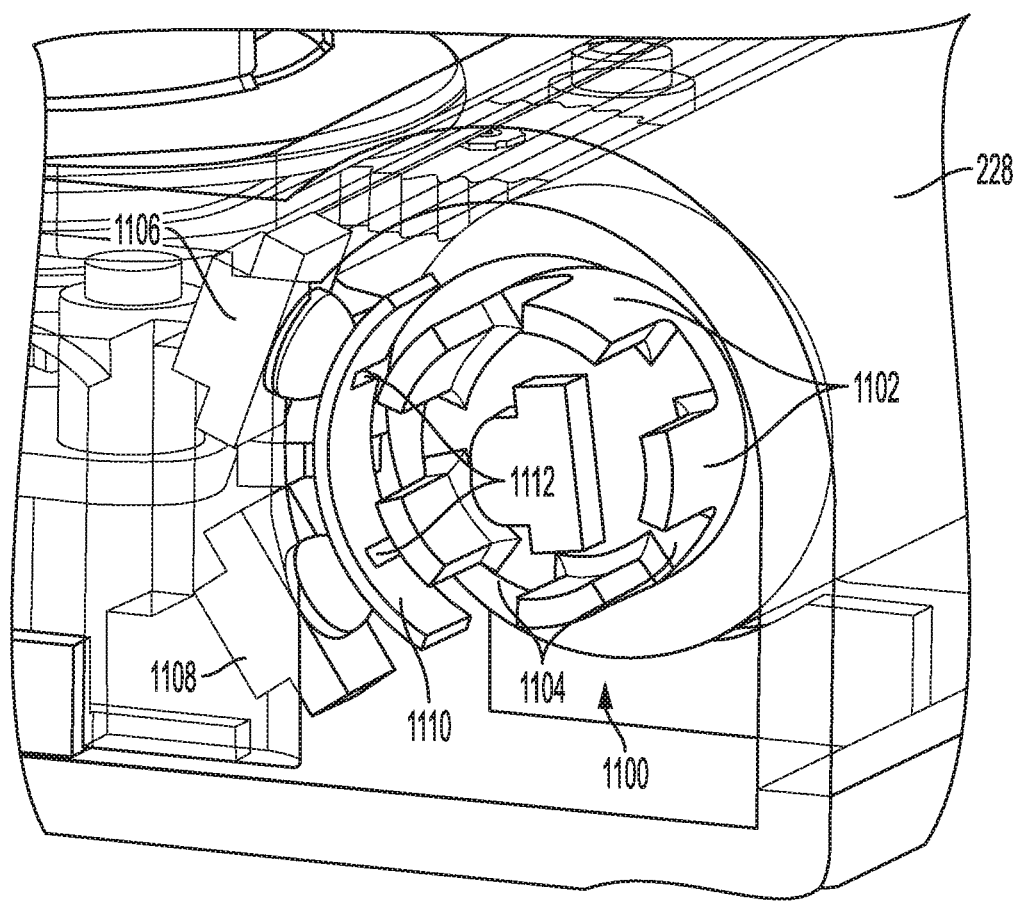
FIG. 11 is an illustration of a three-dimensional encoder 1100, in an example embodiment.

FIG. 11 is an illustration of a three-dimensional encoder 1100, in an example embodiment. Unlike the three-dimensional encoders 700, 900, the three-dimensional encoder 1100 utilizes tabs 1102 and gaps 1104 to provide surfaces or lack thereof from light is either reflected, in the case of the tabs 1102, or not reflected, in the case of the gaps 1104. The optical sensors 1106, 1108 detect the light reflected from the tabs 1102 and not the absence of reflected light when the gaps 1104 align with the optical sensors 1106, 1108. In an example, the optical sensor 1106, 1108 form an angle therebetween of approximately fifty-four (54) degrees. A beam break 1110 includes slits 1112 through which light passes to focus the light for the purposes of the focusing the light for detection by the optical sensors 1106, 1108. The three-dimensional encoder 1100 is rotationally coupled to the motor 228, as with the other encoders 700, 900.

EXAMPLES

In Example 1, an article of footwear includes a midsole, an upper secured with respect to the midsole, a lace extending through the upper, and a motorized lacing system positioned within the midsole, configured to engage with the lace to increase and decrease tension on the lace, the motorized lacing system comprising a motor, including a motor shaft, a spool, coupled to the motor shaft, configured to spool and unspool the lace based on the turning of the motor shaft, a processor circuit, and a three-dimensional encoder defining a major axis and having a surface having a plurality of tabs extending from a drum, an optical sensor, positioned within optical range of the cylindrical encoder, configured to output a signal to the processor circuit indicative of a detected one of the plurality of tabs, and a beam break, positioned between the three-dimensional encoder and the optical sensor, forming a pair of slits, wherein the optical sensor is positioned to view the plurality of tabs through the pair of slits, wherein the processor circuit is configured to operate the motor based, at least in part, on the signal as received from the optical sensor.

In Example 2, the article of footwear of Example 1 optionally further includes that the optical sensor is a first optical sensor and further comprising a second optical sensor spaced apart from the first optical sensor.

In Example 3, the article of footwear of any one or more of Examples 1 and 2 optionally further includes that the first optical sensor is positioned proximate a first one of the pair of slits and the second optical sensor is positioned proximate a second one of the pair of slits.

In Example 4, the article of footwear of any one or more of Examples 1-3 optionally further includes that the first and second optical sensors form an angle of approximately fifty-four degrees with respect to one another.

In Example 5, the article of footwear of any one or more of Examples 1-4 optionally further includes that the tabs are spaced with respect to one another so that when one of the tabs is aligned with one of the slits another one of the tabs is aligned with the other of the slits.

In Example 6, the article of footwear of any one or more of Examples 1-5 optionally further includes that the plurality of tabs is five tabs.

In Example 7, the article of footwear of any one or more of Examples 1-6 optionally further includes that the plurality of tabs is an odd number.

In Example 8, a method includes securing an upper secured with respect to a midsole, extending a lace through the upper, and positioning a motorized lacing system within the midsole, the motorized lacing system configured to engage with the lace to increase and decrease tension on the lace, the motorized lacing system comprising a motor, including a motor shaft, a spool, coupled to the motor shaft, configured to spool and unspool the lace based on the turning of the motor shaft, a processor circuit, and an optical encoder, comprising a three-dimensional encoder defining a major axis and having a surface having a plurality of tabs extending from a drum, an optical sensor, positioned within optical range of the cylindrical encoder, configured to output a signal to the processor circuit indicative of a detected one of the plurality of tabs, and a beam break, positioned between the three-dimensional encoder and the optical sensor, forming a pair of slits, wherein the optical sensor is positioned to view the plurality of tabs through the pair of slits, wherein the processor circuit is configured to operate the motor based, at least in part, on the signal as received from the optical sensor.

In Example 9, the method of Example 8 optionally further includes that the optical sensor is a first optical sensor and further comprising a second optical sensor spaced apart from the first optical sensor.

In Example 10, the method of any one or more of Examples 8 and 9 optionally further includes that the first optical sensor is positioned proximate a first one of the pair of slits and the second optical sensor is positioned proximate a second one of the pair of slits.

In Example 11, the method of any one or more of Examples 8-10 optionally further includes that the first and second optical sensors form an angle of approximately fifty-four degrees with respect to one another.

In Example 12, the method of any one or more of Examples 8-11 optionally further includes that the tabs are spaced with respect to one another so that when one of the tabs is aligned with one of the slits another one of the tabs is aligned with the other of the slits.

In Example 13, the method of any one or more of Examples 8-12 optionally further includes that the plurality of tabs is five tabs.

In Example 14, the method of any one or more of Examples 8-13 optionally further includes that the plurality of tabs is an odd number.

In Example 15, a motorized lacing system includes a motor, including a motor shaft, a spool, coupled to the motor shaft, configured to spool and unspool the lace based on the turning of the motor shaft, a processor circuit, and a three-dimensional encoder defining a major axis and having a surface having a plurality of tabs extending from a drum, an optical sensor, positioned within optical range of the cylindrical encoder, configured to output a signal to the processor circuit indicative of a detected one of the plurality of tabs, and a beam break, positioned between the three-dimensional encoder and the optical sensor, forming a pair of slits, wherein the optical sensor is positioned to view the plurality of tabs through the pair of slits, wherein the processor circuit is configured to operate the motor based, at least in part, on the signal as received from the optical sensor.

In Example 16, the motorized lacing system of Example 1 optionally further includes that the optical sensor is a first optical sensor and further comprising a second optical sensor spaced apart from the first optical sensor.

In Example 17, the motorized lacing system of any one or more of Examples 1 and 2 optionally further includes that the first optical sensor is positioned proximate a first one of the pair of slits and the second optical sensor is positioned proximate a second one of the pair of slits.

In Example 18, the motorized lacing system of any one or more of Examples 1-3 optionally further includes that the first and second optical sensors form an angle of approximately fifty-four degrees with respect to one another.

In Example 19, the motorized lacing system of any one or more of Examples 1-4 optionally further includes that the tabs are spaced with respect to one another so that when one of the tabs is aligned with one of the slits another one of the tabs is aligned with the other of the slits.

In Example 20, the motorized lacing system of any one or more of Examples 1-5 optionally further includes that the plurality of tabs is five tabs.

In Example 21, the motorized lacing system of any one or more of Examples 1-6 optionally further includes that the plurality of tabs is an odd number.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms. Modules may constitute either software modules (e.g., code embodied on a machine-readable medium or in a transmission signal) or hardware modules. A "hardware module" is a tangible unit capable of performing certain operations and may be configured or arranged in a certain physical manner. In various example embodiments, one or more computer systems (e.g., a standalone computer system, a client computer system, or a server computer system) or one or more hardware modules of a computer system (e.g., a processor or a group of processors) may be configured by software (e.g., an application or application portion) as a hardware module that operates to perform certain operations as described herein.

In some embodiments, a hardware module may be implemented mechanically, electronically, or any suitable combination thereof. For example, a hardware module may include dedicated circuitry or logic that is permanently configured to perform certain operations. For example, a hardware module may be a special-purpose processor, such as a field programmable gate array (FPGA) or an ASIC. A hardware module may also include programmable logic or circuitry that is temporarily configured by software to perform certain operations. For example, a hardware module may include software encompassed within a general-purpose processor or other programmable processor. It will be appreciated that the decision to implement a hardware module mechanically, in dedicated and permanently configured circuitry, or in temporarily configured circuitry (e.g., configured by software) may be driven by cost and time considerations.

Accordingly, the phrase "hardware module" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple hardware modules exist contemporaneously, communications may be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions described herein. As used herein, "processor-implemented module" refers to a hardware module implemented using one or more processors.

Similarly, the methods described herein may be at least partially processor-implemented, a processor being an example of hardware. For example, at least some of the operations of a method may be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an application program interface (API)).

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or any suitable combination thereof), registers, or other machine components that receive, store, transmit, or display information. Furthermore, unless specifically stated otherwise, the terms "a" or "an" are herein used, as is common in patent documents, to include one or more than one instance. Finally, as used herein, the conjunction "or" refers to a non-exclusive "or," unless specifically stated otherwise.

What is claimed is:

1. An article of footwear, comprising:
    a midsole;
    an upper secured with respect to the midsole;
    a lace extending through the upper; and
    a motorized lacing system positioned within the midsole, configured to engage with the lace to increase and decrease tension on the lace, the motorized lacing system comprising:
        a motor;
        a spool, coupled to the motor, configured to spool and unspool the lace based on the turning of the motor;
        a processor circuit; and
        an optical encoder, comprising:
            an encoder defining a major axis and having a surface having a plurality of tabs;
            an optical sensor, positioned within optical range of the encoder, configured to output a signal to the processor circuit indicative of a detected one of the plurality of tabs; and
            a beam break, positioned between the encoder and the optical sensor, wherein the optical sensor is positioned to view the plurality of tabs through the beam break;
        wherein the processor circuit is configured to operate the motor based, at least in part, on the signal as received from the optical sensor.

2. The article of footwear of claim 1, wherein the optical sensor is a first optical sensor and further comprising a second optical sensor spaced apart from the first optical sensor.

3. The article of footwear of claim 2, wherein the first optical sensor is positioned proximate a first opening in the beam break and the second optical sensor is positioned proximate a second opening in the beam break.

4. The article of footwear of claim 2, wherein the first and second optical sensors form an angle of approximately fifty-four degrees with respect to one another.

5. The article of footwear of claim 4, wherein the beam break comprises a pair of slits, wherein the tabs are spaced with respect to one another so that when one of the tabs is aligned with one of the slits another one of the tabs is aligned with the other of the slits.

6. The article of footwear of claim 5, wherein the plurality of tabs is five tabs.

7. The article of footwear of claim 5, wherein the plurality of tabs is an odd number.

* * * * *

UNITED STATES PATENT AND TRADEMARK OFFICE
CERTIFICATE OF CORRECTION

| | | |
|---|---|---|
| PATENT NO. | : 12,178,291 B2 | Page 1 of 1 |
| APPLICATION NO. | : 17/967064 | |
| DATED | : December 31, 2024 | |
| INVENTOR(S) | : Donohoe et al. | |

It is certified that error appears in the above-identified patent and that said Letters Patent is hereby corrected as shown below:

On the Title Page

On page 2, in Column 2, under "Foreign Patent Documents", Line 11, delete "105203464" and insert --H05203464-- therefor Signed and Sealed this
Fourth Day of March, 2025

Coke Morgan Stewart
*Acting Director of the United States Patent and Trademark Office*